United States Patent
McBrien et al.

(10) Patent No.: US 9,364,888 B2
(45) Date of Patent: *Jun. 14, 2016

(54) REGENERATING AN ADDITIVELY MANUFACTURED COMPONENT TO CURE DEFECTS AND ALTER MICROSTRUCTURE

(71) Applicant: United Technologies Corporation, Hartford, CT (US)

(72) Inventors: John McBrien, South Glastonbury, CT (US); Lea Kennard Castle, Vernon, CT (US); Brandon W. Spangler, Vernon, CT (US); JinQuan Xu, East Greenwich, RI (US)

(73) Assignee: United Technologies Corporation, Hartford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/784,849

(22) PCT Filed: Apr. 17, 2014

(86) PCT No.: PCT/US2014/034453
§ 371 (c)(1),
(2) Date: Oct. 15, 2015

(87) PCT Pub. No.: WO2014/204569
PCT Pub. Date: Dec. 24, 2014

(65) Prior Publication Data
US 2016/0059302 A1    Mar. 3, 2016

Related U.S. Application Data

(60) Provisional application No. 61/813,871, filed on Apr. 19, 2013.

(51) Int. Cl.
B22C 7/02    (2006.01)
B22D 23/06    (2006.01)
(Continued)

(52) U.S. Cl.
CPC ... *B22C 7/02* (2013.01); *B22C 9/02* (2013.01); *B22C 9/043* (2013.01); *B22C 9/10* (2013.01);
(Continued)

(58) Field of Classification Search
CPC .............. B22C 7/02; B22C 9/02; B22C 9/04; B22C 9/043; B22D 23/06
USPC ....................... 164/9, 24, 34, 35, 80, 516–529
See application file for complete search history.

(56) References Cited

U.S. PATENT DOCUMENTS 5,868,194 A * 2/1999 Horwood .................. B22C 9/04
164/122.2
7,413,001 B2 * 8/2008 Wang ......................... B22C 9/10
164/361

(Continued)

OTHER PUBLICATIONS

International Search Report and Written Opinion from PCT Application U.S. Appl. No. PCT/US2014/034453, dated Jan. 7, 2015, 9 pages.

(Continued)

*Primary Examiner* — Kevin E Yoon
(74) *Attorney, Agent, or Firm* — Kinney & Lange, P.A.

(57) ABSTRACT

One embodiment includes a method to regenerate a component. The method includes additively manufacturing the component with at least a portion of the component in a near finished shape. The component is encased in a shell mold, the shell mold is cured, the encased component is placed in a furnace and the component is melted, the component is solidified in the shell mold, and the shell mold is removed from the solidified component.

20 Claims, 5 Drawing Sheets

(51) Int. Cl.

| | | |
|---|---|---|
| *F01D 5/28* | (2006.01) | |
| *F01D 5/18* | (2006.01) | |
| *B22F 3/105* | (2006.01) | |
| *B22F 5/04* | (2006.01) | |
| *C30B 11/00* | (2006.01) | |
| *C30B 29/52* | (2006.01) | |
| *B22C 9/04* | (2006.01) | |
| *B22C 9/02* | (2006.01) | |
| *B22C 9/10* | (2006.01) | |
| *B22C 9/22* | (2006.01) | |
| *B23K 15/00* | (2006.01) | |
| *B32B 1/08* | (2006.01) | |
| *B32B 3/08* | (2006.01) | |
| *B32B 3/26* | (2006.01) | |
| *B32B 5/16* | (2006.01) | |
| *B32B 9/00* | (2006.01) | |
| *B33Y 10/00* | (2015.01) | |
| *B33Y 80/00* | (2015.01) | |

(52) U.S. Cl.
CPC . *B22C 9/22* (2013.01); *B22D 23/06* (2013.01); *B22F 3/1055* (2013.01); *B22F 5/04* (2013.01); *B23K 15/0006* (2013.01); *B23K 26/342* (2015.10); *B32B 1/08* (2013.01); *B32B 3/08* (2013.01); *B32B 3/26* (2013.01); *B32B 5/16* (2013.01); *B32B 9/005* (2013.01); *C30B 11/00* (2013.01); *C30B 29/52* (2013.01); *F01D 5/18* (2013.01); *F01D 5/28* (2013.01); *B32B 2250/03* (2013.01); *B32B 2264/105* (2013.01); *B32B 2603/00* (2013.01); *B33Y 10/00* (2014.12); *B33Y 80/00* (2014.12); *F05D 2230/31* (2013.01); *Y02P 10/295* (2015.11)

(56) References Cited

U.S. PATENT DOCUMENTS

| | | | |
|---|---|---|---|
| 8,327,911 B2 * | 12/2012 | Kush | B28B 1/001 164/132 |
| 2005/0040147 A1 | 2/2005 | Hoebel et al. | |
| 2005/0205232 A1 | 9/2005 | Wang et al. | |
| 2010/0025001 A1 | 2/2010 | Lee et al. | |
| 2013/0004680 A1 | 1/2013 | Godfrey et al. | |
| 2014/0314581 A1 * | 10/2014 | McBrien | F01D 5/28 416/96 R |
| 2015/0290707 A1 * | 10/2015 | Xu | B22D 23/06 264/467 |
| 2015/0321250 A1 * | 11/2015 | Xu | B23P 6/005 164/15 |
| 2015/0322799 A1 * | 11/2015 | Xu | F01D 5/18 416/231 R |
| 2016/0061044 A1 * | 3/2016 | McBrien | F01D 5/28 428/71 |

OTHER PUBLICATIONS

Gasser, A., et al., "Laser Additive Manufacturing, Laser Metal Deposition (LMD) and Selective Laser Melting (SLM) in Turbo-Engine Applications", from Laser Material Processing, Apr. 2010, pp. 58-63.

* cited by examiner

US 9,364,888 B2

REGENERATING AN ADDITIVELY MANUFACTURED COMPONENT TO CURE DEFECTS AND ALTER MICROSTRUCTURE

CROSS-REFERENCE TO RELATED APPLICATION

This application claims priority to U.S. provisional application Ser. No. 61/813,871, filed on Apr. 19, 2013, and entitled "Method For Forming Single Crystal Parts Using Additive Manufacturing And Remelt," the disclosure of which is incorporated by reference herein in its entirety.

BACKGROUND

The present embodiments relate generally to the field of additive manufacturing and, more particularly, to curing defects and/or creating a single crystal microstructure or columnar grain microstructure in an additively manufactured component.

Additive manufacturing is a process by which parts can be made in a layer-by-layer fashion by machines that create each layer according to a three dimensional (3D) computer model of the part. In powder bed additive manufacturing, a layer of powder is spread on a platform and selective areas are joined by sintering or melting by a directed energy beam. The platform is indexed down, another layer of powder is applied, and selected areas are again joined. The process is repeated until a finished 3D part is produced. In direct deposit additive manufacturing technology, small amounts of molten or semi-solid material are applied to a platform according to a 3D model of a part by extrusion, injection, or wire feed and energized by an energy beam to bond the material to form a part. Common additive manufacturing processes include selective laser sintering, direct laser melting, direct metal laser sintering (DMLS), electron beam melting, laser powder deposition, electron beam wire deposition, etc.

Because a part is produced in a continuous process in an additive manufacturing operation, features associated with conventional manufacturing processes such as machining, forging, welding, casting, etc. can be eliminated leading to savings in cost, material, and time. Furthermore, additive manufacturing allows components with complex geometries to be built relatively easily, compared to conventional manufacturing processes.

However, despite its benefits, additive manufacturing has limitations. One limitation of additive manufacturing is that it is incapable of reliably producing components with a single crystal microstructure or columnar grain microstructure. Rather, an inherent feature of an additively manufactured component is a polycrystalline microstructure. The inability to additively manufacture single crystal or columnar grain components can be problematic. For example, a number of gas turbine engine components generally need to have a single crystal microstructure to withstand high temperature, high stress operating environments (e.g., components located in a hot gas stream). As well, for some gas turbine engine components a columnar grain microstructure can beneficial.

A second limitation of additive manufacturing is quality control of the component being additively built. Generally, component subsurface defects are inherent in additive manufacturing processes. It can take tens of hours (or more) to additively build a component, yet it is inevitable that at least some finished additively built components will have subsurface defects, such as contaminates and/or voids. As a result, such defective components are rejected after spending significant resources in building these components.

SUMMARY

One embodiment includes a method to manufacture a component. The method includes additively manufacturing the component with at least a portion of the component in a near finished shape. The component is encased in a shell mold, the shell mold is cured, the encased component is placed in a furnace and the component is melted, the component is solidified in the shell mold, and the shell mold is removed from the solidified component.

Another embodiment includes a method to make a component with internal passageways. The method includes additively manufacturing the component with an internal passageway with at least a portion of the component in a near finished shape. The internal passageway is filled with a slurry and the slurry is cured to form a core. The component in encased in a shell mold, and the shell mold is cured. The encased component is placed in a furnace and the component is melted. The component is solidified in the shell mold, and the shell mold and core are removed from the solidified component.

Figure 1:
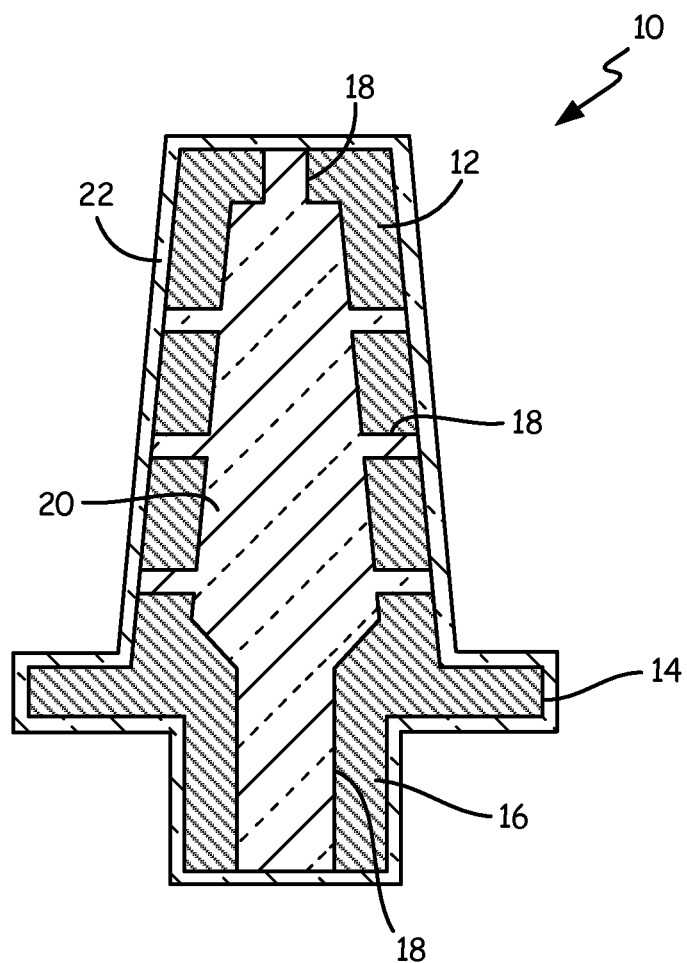
FIG. 1 is a cross-sectional view of an intermediate component, with internal passageways, having a core and a shell mold.

While the above-identified drawing figures set forth one or more embodiments of the invention, other embodiments are also contemplated. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Generally, the present embodiments provide for making or regenerating an additively manufactured component to create a single crystal or columnar grain microstructure in the component and/or cure defects in the component such that the component can be used as intended and need not be rejected. The single crystal or columnar grain microstructure is created and/or the defects are cured by using the additively manufactured component as a pattern to create a shell mold, similar to a shell mold for a conventional investment casting process. The component can be completely encased in a shell mold, melted, and then directionally solidified to produce a substantially single crystal or columnar grain microstructure, defectless component of the same, potentially complex, shape. Other features and benefits will be recognized in view of the entirety of the present disclosure, including the accompanying figures.

FIG. 1 is a schematic, cross-sectional view of additively manufactured intermediate component 10. Intermediate component 10 can be a turbine blade which includes airfoil 12, platform 14, root 16, and internal passageways 18. Intermediate component 10 as shown in FIG. 1 is just one example, provided by way of example and not limitation. Additively manufactured component 10 can be any component capable of being additively manufactured, which can include, for example, a fuel nozzle or turbine blade or vane. Included with intermediate component 10, and shown in FIG. 1, are inner core 20 and outer shell mold 22. In one example as shown in FIG. 1, core 20 is a ceramic core and shell mold 22 is a ceramic shell mold. Other core 20 and shell mold 22 materials are also contemplated.

Intermediate component 10 is additively manufactured in a near finished shape such that airfoil 12, platform 14, root 16, and internal passageways 18 are integral to component 10. However, ceramic core 20 and ceramic shell mold 22 are not formed as part of component 10 during an additive manufacturing process. Component 10 can be additively manufactured using any type of additive manufacturing process which utilizes layer-by-layer construction, including, but not limited to, selective laser sintering, selective laser melting, direct metal deposition, direct metal laser sintering (DMLS), direct metal laser melting, electron beam melting, electron beam wire melting and others known in the art. Component 10 can be additively manufactured to have up to 15 percent additional material by volume in the near finished shape (i.e., intermediate component 10 as shown in FIG. 1) as compared to a desired finished configuration of component 10 (i.e., component 10 after being regenerated to be substantially free of defects and/or a single crystal or columnar grain microstructure). The additional material can be additively manufactured as part of component 10. Any additional material of component 10 can be located at any location where extra material can be machined. In one example, the extra material can be located at root 16 and/or a tip of airfoil 12. Moreover, component 10 can be additively manufactured to be of a metal, such as a nickel-based superalloy, cobalt-based superalloy, iron-based superalloy, and mixtures thereof.

Component 10, as a result of being additively manufactured, can have defects. Defects (e.g., subsurface) can include unwanted defects, such as contaminates and/or voids. Voids can include, for example, pores and/or cracks. For example, component 10 can have voids greater than 0 percent but less than approximately 15 percent by volume. Often, component 10 will have voids greater than 0 percent but less than approximately 1 percent by volume, and even in some instances less than approximately 0.1 percent by volume. Component 10 may be deemed unsuitable for use as intended when containing unwanted levels of voids, which in many applications can be fractions of a single percent by volume. For this reason, component 10 can be regenerated to cure subsurface defects. Additionally, because component 10 is additively manufactured, component 10 typically has a polycrystalline microstructure. Component 10 may also be deemed unsuitable for use in certain applications (e.g., high temperature, high stress environments) when component 10 has a polycrystalline microstructure. Rather, component 10 can be better suited for such applications when component 10 has a single crystal or columnar grain microstructure. For this reason, component 10 can also be regenerated to have a single crystal or columnar grain microstructure.

As part of a process for regenerating component 10 to be substantially free of defects and/or of a single crystal or columnar grain microstructure, component 10 has ceramic core 20 and ceramic shell mold 22 added to component 10 after component 10 is additively manufactured. In other embodiments, component 10 can have core 20 and shell mold 22 of materials other than ceramic. Ceramic core 20 is formed in internal passageways 18, such that ceramic core 20 substantially conforms to a shape of internal passageways 18. Ceramic core 20 can be formed by filling internal passageways 18 with a ceramic slurry, resulting in a volume of internal passageways 18 being occupied by the ceramic slurry. The ceramic slurry can be ceramics commonly used as core materials for investment casting, for example, silica, alumina, zircon, cobalt, mullite, kaolin, and mixtures thereof. Once internal passageways 18 are filled, or substantially filled, with the ceramic slurry, the ceramic slurry is cured to form ceramic core 20 (having generally solid and rigid properties). In an alternative embodiment, where a component has been additively manufactured and does not have an internal passageway 18, the component can be regenerated to substantially cure defects and/or have a single crystal or columnar grain microstructure without the use of ceramic core 20.

Ceramic shell mold 22 is also added to component 10. Ceramic shell mold 22 can encase an entirety of component 10, such that an entire external surface of component 10 is covered by ceramic shell mold 22 and ceramic shell mold 22 substantially conforms to a shape of component 10. Intermediate component 10 serves as a pattern for making ceramic shell mold 22, because component 10 has a near finished shape. Ceramic shell mold 22 can be formed to encase component 10 by dipping the entirety of component 10 into a ceramic slurry to form a layer of a green (i.e. uncured) ceramic shell mold on the entirety of component 10. The layer is dried and the component is dipped and dried repeatedly for as many times as necessary to form the green ceramic shell mold with an acceptable thickness. A thickness of the green ceramic shell mold can range from approximately 5 mm to approximately 32 mm. The green ceramic shell mold is then cured to form ceramic shell mold 22 (having generally solid and rigid properties). The ceramic slurry, and thus ceramic shell mold 22, can be, for example, silica, alumina, zircon, cobalt, mullite, kaolin, and mixtures thereof. Alternatively, in one example, ceramic shell mold 22 and ceramic core 20 can be formed simultaneously such that ceramic shell mold 22 encases the entire external surface of component 10 and ceramic core 20 encases an entire surface of internal passageways 18.

Figure 2:
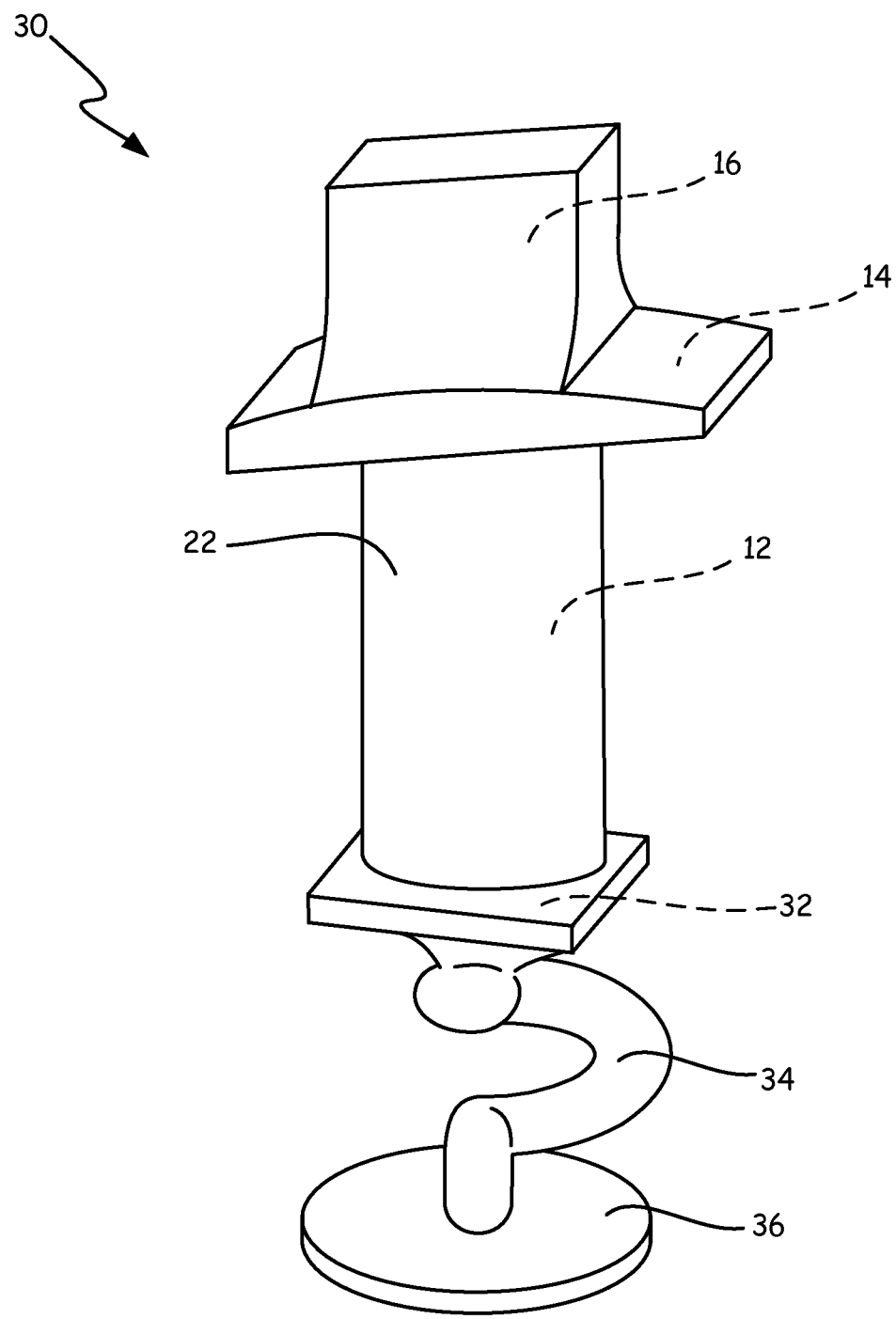
FIG. 2 is a perspective view of a component with a grain selector.

FIG. 2 is a perspective view of component 30. Component 30 is an additively manufactured blade and includes airfoil 12, platform 14, root 16, shell mold 22, and shroud 32 (component 30 also has internal passageways 18 and core 20, which are not shown in FIG. 2). As a result of being additively manufactured, component 30 has a polycrystalline structure. Component 30 can be regenerated or made to have a single crystal or columnar grain microstructure. As part of a process to regenerate component 30, component 30 is made to have core 20 and shell mold 22, similar to that shown and described for FIG. 1. Also shown in FIG. 2 are grain selector 34 and starter block 36. Grain selector 34 is a pigtail (i.e. helix) type grain selector in the illustrated embodiment. However, grain selector 34 can be any other type of grain selector, such as an angled grain selector or a restrictor grain selector. Grain selector 34 is connected to component 30, and starter block 36 is connected to grain selector 34. As shown in FIG. 2, grain selector 34 is connected to component 30 at or near shroud 32, but in other embodiments grain selector 34 can be connected to component 30 at other component 30 locations. Grain selector 34 and starter block 36 are used in one embodiment of a method to regenerate and directionally solidify component 30 such that component 30 is made to have a single crystal or columnar grain microstructure.

Grain selector 34 and starter block 36 are not part of a finished shape of component 30. Grain selector 34 and starter block 36 can be connected to component 30 after component 30 is additively manufactured. Additively manufacturing component 30 in a near finished shape can include additively manufacturing airfoil 12, platform 14, root 16, internal passageways 18, and/or shroud 32 to be integral to component 30. Therefore, although component 30 as shown in FIG. 2 includes grain selector 34 and starter block 36, at least a portion of component 30 is in a near finished shape.

Figure 3:
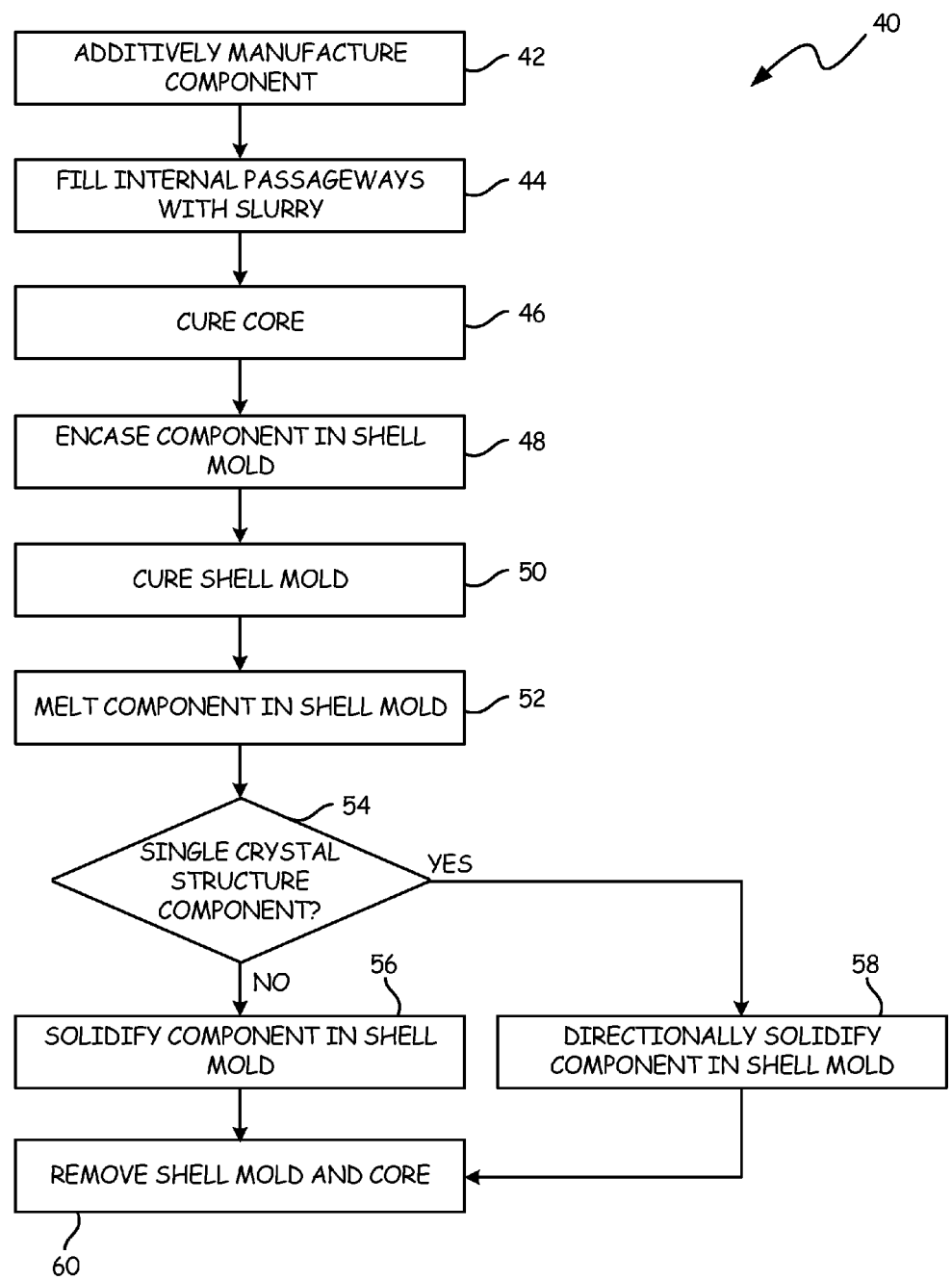
FIG. 3 is a flow chart illustrating a method to make an additively manufactured component.

FIG. 3 is a flow chart illustrating an embodiment of additively manufactured component regeneration method 40. Method 40 can be used to cure additively manufactured component 10 of defects and/or form component 10 to be of a single crystal or columnar grain microstructure so that component 10 can be used as desired. The following discussion references intermediate component 10, but can be applied equally to other components, including component 30.

First, a body of intermediate component 10, which can optionally include internal passageway 18, is additively manufactured in a near finished shape (step 42). Any type of additive manufacturing process including, but not limited to, selective laser sintering, selective laser melting, direct metal deposition, direct metal laser sintering, direct metal laser melting, electron beam melting, electron beam wire melting, and others known in the art can be used to additively manufacture component 10. Moreover, component 10 can be additively manufactured to be of a metal, such as a nickel-based superalloy, cobalt-based superalloy, iron-based superalloy, and mixtures thereof. Additively manufactured component 10 has a polycrystalline structure and unwanted defects, which can include voids (e.g., pores and/or cracks) greater than 0 percent but less than approximately 15 percent by volume (other unwanted defects can include contamination and/or cracks). In one embodiment, component 10 has unwanted voids greater than 0 percent but less than approximately 1 percent by volume, and even less than approximately 0.1 percent by volume. Furthermore, component 10 can be additively manufactured to have up to 15 percent additional material by volume in the near finished shape compared to a desired finished configuration. This means that component 10 as additively built can include extra material beyond what is needed to form the desired finished configuration. The extra material does not count a starter seed or grain selector, when used. This extra material can be located on component 10 at any location where extra material may be machined. In one example, the extra material can be located at root 16 and/or the tip of airfoil 12 such as at a discrete sprue location. In one embodiment, component 10 is intentionally additively manufactured to contain a hollow portion (e.g., a hollow portion resembling a pore of a desired size, shape, etc.) such that the additive manufacturing process is less time consuming.

Next, at least one internal passageway 18, if present, can be filled with a ceramic slurry or other suitable core material (step 44). Filling internal passageway 18 with the slurry results in a volume of internal passageway 18 being occupied by the slurry. Each internal passageway 18 can be filled with the slurry. The slurry can be of ceramic materials commonly used as core materials in conventional casting processes, including, but not limited to, silica, alumina, zircon, cobalt, mullite, and kaolin.

Once internal passageways 18 are filled with the ceramic slurry, the ceramic slurry is cured to form inner core 20 (step 46). The slurry can be cured in situ in component 10 by a suitable thermal process. Core 20 occupies internal passageways 18, such that core 20 substantially conforms to a shape of internal passageways 18 of component 10. Steps 44 and 46 can be omitted if no internal passageway 18 is present.

Then, component 10 is encased in a green (i.e. uncured) shell mold (step 48). The green shell mold can encase an entirety of component 10 (i.e. substantially seals component 10), such that an entire external surface of component 10 is covered by the green shell mold and the green shell mold substantially conforms to a shape of component 10. There can be instances where core 20 is at or near the external surface of component 10 and core 20 then forms a portion of shell mold 22, resulting in gaps in shell mold 22 over portions of core 20. The green shell mold can be formed to encase component 10 by dipping the entirety of component 10 into a ceramic slurry to form a layer of the green ceramic shell mold on the entirety of component 10. The layer is dried and the component is dipped and dried repeatedly for as many times as necessary to form the green shell mold with an acceptable thickness. As one alternative to dipping component 10 into the ceramic slurry, the ceramic slurry can be poured onto component 10 and dried. An acceptable thickness of the green shell mold can range from approximately 5 mm to approximately 32 mm. The green shell mold can be heated at an intermediate temperature to partially sinter the ceramic (or other shell material) and burn off any binder material in the green shell mold.

The green shell mold is then cured to form outer shell mold 22 (step 50). The shell mold 22, can be, for example, silica, alumina, zircon, cobalt, mullite, kaolin, and mixtures thereof. Ceramic shell mold 22 can be cured at a temperature ranging between approximately 649° C. (1200° F.) to approximately 982° C. (1800° F.) for a time ranging between approximately 10 to approximately 120 minutes to cure ceramic shell mold 22 to full density. Because the green ceramic shell mold encased an entirety of component 10 and substantially conforms to a shape of component 10, component 10 serves as a pattern in ceramic shell mold 22 (in lieu of a wax pattern used in traditional investment casting processes).

Next, component 10 is melted in ceramic shell mold 22, which now has the pattern of component 10 (step 52). One way of melting component 10 in ceramic shell mold 22 is to place at least part of component 10 in a furnace. However, other means of applying heat such that component 10 is melted in ceramic shell mold 22 can be used. For example, a dual chill block and furnace assembly can be used. The material from which component 10 is made generally has a melting point lower than a melting point of the material from which core 20 and shell mold 22 are formed. This can allow component 10 to melt inside shell mold 20 without contaminating component 10 material with core 20 and/or shell mold 22 material. Melting component 10 in shell mold 22 allows component 10 material to densify, with assistance of gravity or other means, and substantially eliminate the unwanted voids originally present in component 10. If component 10 was additively manufactured to have up to 15 percent additional material by volume, this additional material also melts and fills into pores and/or cracks in component 10 (such that the additional material that fills into pores and/or cracks in component 10 is no longer present where originally located). Melting (and re-solidifying) component 10 in shell mold 22 can also help to rid component 10 of contaminates, which are generally more soluble in component 10 liquid phase than component 10 solid phase.

Once component 10 has melted, it can be determined whether component 10 is to have a single crystal or columnar grain microstructure formed (step 54). For example, in applications where component 10 is to be exposed in a high temperature, high stress environment component 10 can have a single crystal microstructure. On the other hand, there can be component 10 applications where neither a single crystal nor columnar grain microstructure is desired.

If a single crystal or columnar grain microstructure is not desired, melted component 10 is solidified in shell mold 22 (step 56). Component 10 can be solidified using a chill block, or any other means of cooling component 10 to a temperature at which component 10 can solidify. Solidifying component 10 in shell mold 22 forms component 10 to be of the same shape that component 10 was originally additively manufactured as, but now component 10 has densified and reduced or even substantially eliminated voids or other defects (i.e. to a desired finished configuration). A polycrystalline microstructure can result from step 56.

If a single crystal or columnar grain microstructure is desired, melted component 10 is directionally solidified in shell mold 22 (step 58). Melted component 10 can be directionally solidified using any suitable directional solidification means, which can include using a starter seed or grain selector 34 to enable a single crystal or columnar grain orientation to form (discussed further below). The starter seed or grain selector 34 can be selected based upon whether a single crystal or columnar grain microstructure is desired. Directionally solidifying component 10 in shell mold 22 forms component 10 to be both of a single crystal (or columnar grain) structure and of the same shape that component 10 was originally manufacture as. Additionally, component 10 densifies and is substantially cured of voids, contaminates, or other defects. For instance, when directionally solidifying component 10 using a starter seed or grain selector 34, contaminates in component 10 will be pushed, or collected, by the solidification interface into a common area of component 10 which can then be removed and scrapped.

Finally, once component 10 has solidified or directionally solidified, core 20 and shell mold 22 are removed from component 10 (step 60). For example, core 20 can be etched out or removed by caustic leaching and shell mold 22 can be knocked out. Finished component 10 can also be inspected to ensure unwanted defects, such as voids, have been reduced or substantially eliminated, that component 10 has a single crystal or columnar grain microstructure if desired, and finished component 10 has the same shape as additively manufactured component 10. Method 40 can then be repeated if needed.

Where a component has been additively manufactured and does not have an internal passageway 18, the component can be regenerated to substantially cure defects and/or form a single crystal or columnar grain microstructure similar to that described for method 40. However, because there is no internal passageway 18, steps 44 and 46 need not be performed.

Figure 4:
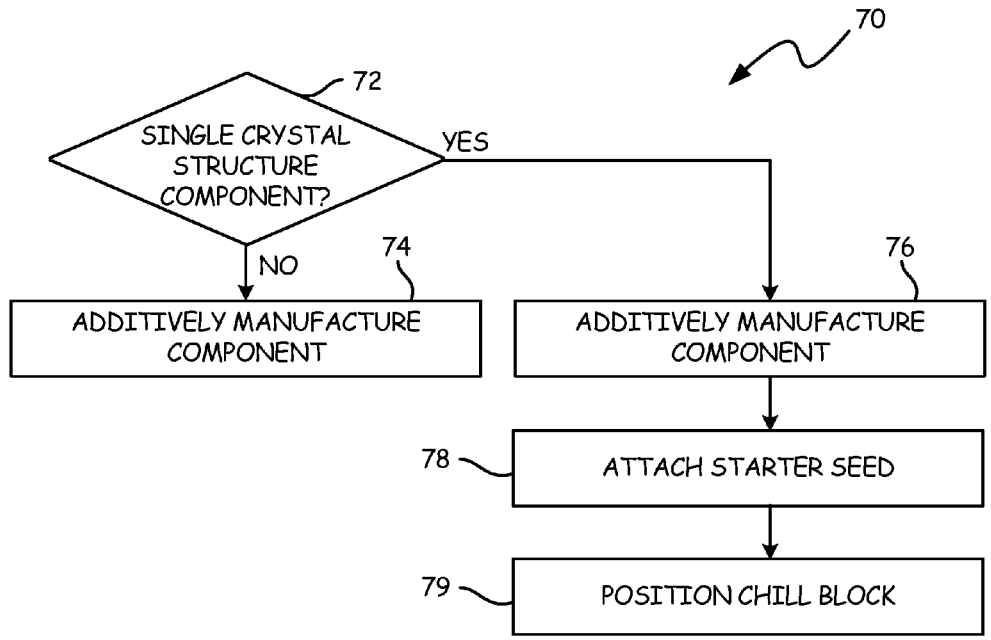
FIG. 4 is a flow chart illustrating an embodiment of a method to make a single crystal or columnar grain additively manufactured intermediate component.
Figure 5:
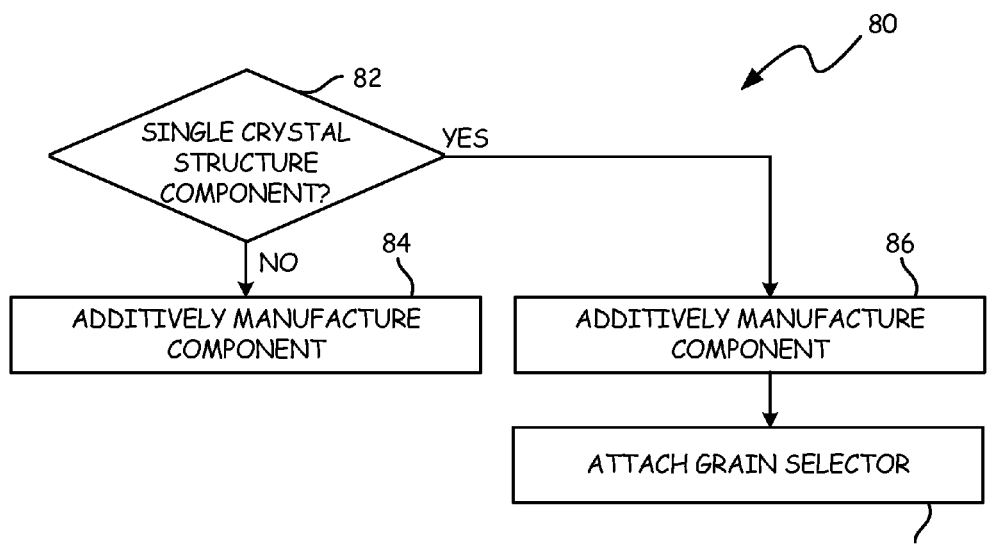
FIG. 5 is a flow chart illustrating another embodiment of a method to make a single crystal or columnar grain additively manufactured intermediate component.
Figure 6:
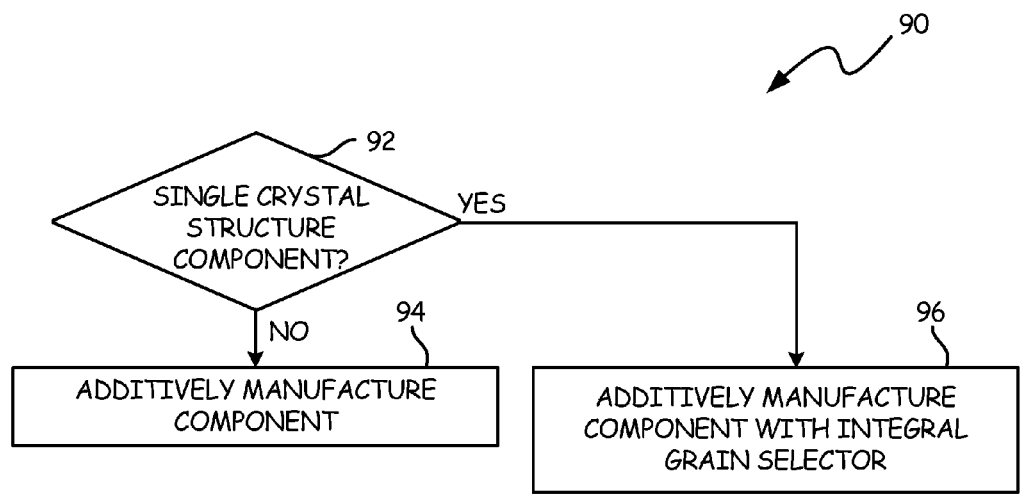
FIG. 6 is a flow chart illustrating a further embodiment of a method to make a single crystal or columnar grain additively manufactured intermediate component.

Component 10 can be regenerated or made using a number of alternative embodiments, some examples of which are described with respect to FIGS. 4-6. Again, the following discussion references intermediate component 10, but can be applied equally to other components, including component 30.

FIG. 4 is a flow chart illustrating method 70 for making a single crystal or columnar grain additively manufactured intermediate component 10. First, it must be determined whether additively manufactured component 10 is desired to be of a single crystal or columnar grain microstructure (step 72). If component 10 is desired to be of neither a single crystal nor columnar grain microstructure, component 10 can be additively manufactured in a conventional manner (step 74). As noted previously, conventionally additively manufacturing component 10 inherently results in component 10 being of a polycrystalline microstructure.

However, if component 10 is desired to be of a single crystal or columnar grain microstructure then additional steps can be taken. First, component 10 is additively manufactured, and thus of a polycrystalline microstructure (step 76). After component 10 is additively manufactured, a starter seed is attached (step 78). The starter seed can be attached to component 10 by any suitable attachment means, which can include fusing. The starter seed can be attached prior to encasing component 10 in shell mold 22, such that the starter seed is encased within shell mold 22. The starter seed then provides a single crystal or columnar grain orientation from which component 10 is directionally solidified after component 10 is melted in shell mold 22, as described for FIG. 3. A chill block can be positioned when melting component 10 to prevent the starter seed from fully melting (step 79). Preventing the starter seed from fully melting is important because if the starter seed is fully melted, then it may not serve to provide the single crystal or columnar grain orientation for component 10 upon subsequent solidification.

FIG. 5 is a flow chart illustrating method 80 for making a single crystal or columnar grain additively manufactured component 30 (this discussion can apply equally to other components, including component 10). Again, it must be determined whether component 30 is desired to be of a single crystal or columnar grain microstructure (step 82). If component 30 is desired to be of a microstructure other than single crystal or columnar grain, component 30 can be additively manufactured (step 84), and thus of a polycrystalline microstructure.

However, if component 30 is desired to be of a single crystal or columnar grain microstructure then additional steps can be taken. First, component 30 is additively manufactured, and thus of a polycrystalline microstructure (step 86). After component 30 is additively manufactured, grain selector 34 can be attached to component 30 (step 88). Grain selector 34 can be a separately manufactured piece attached to component 30 by any suitable attachment means, which can include fusing. Grain selector 34 then provides a single crystal or columnar grain orientation from which component 30 is directionally solidified after component 30 is melted in shell mold 22, as described for FIG. 3.

FIG. 6 is a flow chart illustrating an alternate method 90 for making a single crystal or columnar grain additively manufactured component 10 (this discussion can apply equally to other components, including component 30). Steps 92 and 94 are similar to that described for FIG. 5. However, step 96 differs. Instead of separately attaching grain selector 34 to component 10 as was described for FIG. 5, grain selector 34 in method 90 is additively manufactured as part of component 10, such that grain selector 34 is integrally and monolithically formed with component 10 (step 96). Integral grain selector 34 otherwise works in a similar way to provide a single crystal or columnar grain orientation when directionally solidifying component 10.

Therefore, the presently disclosed embodiments provide a bridge between using additive manufacturing to produce components (with potentially complex shapes), and yielding single crystal or columnar grain components and/or substantially defectless components. As a result, limitations of additively manufacturing are eliminated while benefits of additive manufacturing are retained.

Discussion of Possible Embodiments

The following are non-exclusive descriptions of possible embodiments of the present invention.

A method to manufacture a component, the method comprising additively manufacturing the component with at least a portion of the component in a near finished shape; encasing the component in a shell mold; curing the shell mold; placing the encased component in a furnace and melting the component; solidifying the component in the shell mold; and removing the shell mold from the solidified component.

The method of the preceding paragraph can optionally include, additionally and/or alternatively, any one or more of the following techniques, steps, features, and/or configurations:

The component is additively manufactured to have voids greater than 0 percent but less than approximately 15 percent by volume.

The component is additively manufactured to have up to 15 percent additional material by volume in the near finished shape compared to a desired finished configuration.

The component is a blade or vane and the up to 15 percent additional material by volume is located at a root or a tip of an airfoil of the component.

Encasing the component in a shell mold comprises encasing an entirety of the component in the shell mold such that an entire external surface of the component is covered by the shell mold.

Encasing the component in the shell mold comprises a process of (a) dipping the entirety of the component in a ceramic slurry to form a layer of the shell mold on the entirety of the component, such that the layer is a ceramic layer; and (b) drying the layer of the shell mold; and (c) repeating steps (a) and (b) until an acceptable shell mold thickness is formed to encase the entirety of the component.

The component is additively manufactured using at least one of selective laser sintering, selective laser melting, direct metal deposition, direct metal laser sintering, direct metal laser melting, and electron beam melting.

The component is additively manufactured to be of a metal selected from the group consisting of a nickel-based superalloy, cobalt-based superalloy, iron-based superalloy, and mixtures thereof.

The component is additively manufactured to have a polycrystalline microstructure in the near finished shape.

Solidifying the component comprises directionally solidifying the component to form a single crystal microstructure.

Solidifying the component comprises directionally solidifying the component to form a single crystal microstructure.

The single crystal structure is formed using at least one of a starter seed and a grain selector used to influence initial directional solidification of the component.

Fusing a starter seed to the additively manufactured component.

The single crystal microstructure is formed using a pigtail grain selector on the component.

The pigtail is additively manufactured to be integrally and monolithically formed with a remainder of the component.

A method to make a component with internal passageways, the method comprising additively manufacturing the component with an internal passageway with at least a portion of the component in a near finished shape; filling the internal passageway with a slurry; curing the slurry to form a core; encasing the component in a shell mold; curing the shell mold; placing the encased component in a furnace and melting the component; solidifying the component in the shell mold; and removing the shell mold and core from the solidified component.

The method of the preceding paragraph can optionally include, additionally and/or alternatively, any one or more of the following techniques, steps, features, and/or configurations:

The component is additively manufactured to have voids greater than 0 percent but less than approximately 15 percent by volume.

The component is additively manufactured to have up to 15 percent additional material by volume in the near finished shape compared to a desired finished configuration.

The component is additively manufactured to have a polycrystalline microstructure and wherein solidifying the component comprises directionally solidifying the component to form a single crystal or columnar grain microstructure.

The single crystal microstructure is formed using a pigtail grain selector on the component.

Although the present invention has been described with reference to preferred embodiments, workers skilled in the art will recognize that changes may be made in form and detail without departing from the spirit and scope of the invention.

The invention claimed is:

1. A method to manufacture a component, the method comprising:
   additively manufacturing the component, at least a portion of which is in a near finished shape;
   encasing the component in a shell mold;
   curing the shell mold;
   placing the encased component in a furnace and melting the component;
   solidifying the component in the shell mold; and
   removing the shell mold from the solidified component.

2. The method of claim 1, wherein the component is additively manufactured to have voids greater than 0 percent but less than approximately 15 percent by volume.

3. The method of claim 1, wherein the component is additively manufactured to have up to 15 percent additional material by volume in the near finished shape compared to a desired finished configuration.

4. The method of claim 3, wherein the component is a blade or vane and the up to 15 percent additional material by volume is located at a root or a tip of an airfoil of the component.

5. The method of claim 1, wherein encasing the component in a shell mold comprises encasing an entirety of the component in the shell mold such that an entire external surface of the component is covered by the shell mold.

6. The method of claim 5, wherein encasing the component in the shell mold comprises a process of:
   (a) dipping the entirety of the component in a ceramic slurry to form a layer of the shell mold on the entirety of the component, such that the layer is a ceramic layer; and
   (b) drying the layer of the shell mold; and
   (c) repeating steps (a) and (b) until an acceptable shell mold thickness is formed to encase the entirety of the component.

7. The method of claim 1, wherein the component is additively manufactured using at least one of selective laser sintering, selective laser melting, direct metal deposition, direct metal laser sintering, direct metal laser melting, and electron beam melting.

8. The method of claim 7, wherein the component is additively manufactured to be of a metal selected from the group consisting of a nickel-based superalloy, cobalt-based superalloy, iron-based superalloy, and mixtures thereof.

9. The method of claim 1, wherein the component is additively manufactured to have a polycrystalline microstructure in the near finished shape.

10. The method of claim 9, wherein solidifying the component comprises directionally solidifying the component to form a columnar grain microstructure.

11. The method of claim 9, wherein solidifying the component comprises directionally solidifying the component to form a single crystal microstructure.

12. The method of claim 11, wherein the single crystal structure is formed using at least one of a starter seed and a grain selector used to influence initial directional solidification of the component.

13. The method of claim 11, and further comprising:
fusing a starter seed to the additively manufactured component.

14. The method of claim 11, wherein the single crystal structure is formed using a pigtail grain selector on the component.

15. The method of claim 14, wherein the pigtail is additively manufactured to be integrally and monolithically formed with a remainder of the component.

16. A method to make a component with internal passageways, the method comprising:
additively manufacturing the component with an internal passageway, at least a portion of which is in a near finished shape;
filling the internal passageway with a slurry;
curing the slurry to form a core;
encasing the component in a shell mold;
curing the shell mold;
placing the encased component in a furnace and melting the component;
solidifying the component in the shell mold; and
removing the shell mold and core from the solidified component.

17. The method of claim 16, wherein the component is additively manufactured to have voids greater than 0 percent but less than approximately 15 percent by volume.

18. The method of claim 16, wherein the component is additively manufactured to have up to 15 percent additional material by volume in the near finished shape compared to a desired finished configuration.

19. The method of claim 16, wherein the component is additively manufactured to have a polycrystalline structure and wherein solidifying the component comprises directionally solidifying the component to form a single crystal or columnar grain microstructure.

20. The method of claim 19, wherein the single crystal microstructure is formed using a pigtail grain selector on the component.

* * * * *